United States Patent
Hellmig et al.

(10) Patent No.: US 10,416,289 B2
(45) Date of Patent: Sep. 17, 2019

(54) INFRARED LASER ILLUMINATION DEVICE

(71) Applicant: PHILIPS PHOTONICS GMBH, Ulm (DE)

(72) Inventors: Joachim Wilhelm Hellmig, Eindhoven (NL); Pieter Hoeven, Eindhoven (NL); Robert Van Der Kloet, Eindhoven (NL); Holger Moench, Eindhoven (NL)

(73) Assignee: PHILIPS PHOTONICS GMBH, Ulm (DE)

( * ) Notice: Subject to any disclaimer, the term of this patent is extended or adjusted under 35 U.S.C. 154(b) by 149 days.

(21) Appl. No.: 15/551,320

(22) PCT Filed: Feb. 4, 2016

(86) PCT No.: PCT/EP2016/052320
§ 371 (c)(1),
(2) Date: Aug. 16, 2017

(87) PCT Pub. No.: WO2016/131658
PCT Pub. Date: Aug. 25, 2016

(65) Prior Publication Data
US 2018/0038944 A1  Feb. 8, 2018

(30) Foreign Application Priority Data
Feb. 19, 2015 (EP) .................... 15155687

(51) Int. Cl.
*G01S 7/481* (2006.01)
*G01S 17/89* (2006.01)
*H01S 5/42* (2006.01)

(52) U.S. Cl.
CPC ............ *G01S 7/4815* (2013.01); *G01S 17/89* (2013.01); *H01S 5/423* (2013.01)

(58) Field of Classification Search
CPC ...... G01S 7/4815; G01S 17/89; G01S 17/499; H01S 5/423; H01S 5/42; H01S 5/183; H04N 13/0253; H04N 13/02
See application file for complete search history.

(56) References Cited

U.S. PATENT DOCUMENTS

2005/0023356 A1  2/2005  Wiklof et al.
2011/0101239 A1  5/2011  Woodhouse et al.
(Continued)

FOREIGN PATENT DOCUMENTS

DE  3219082 A1  11/1983
EP  1031471 A1  8/2000
(Continued)

OTHER PUBLICATIONS

Jeelani PHD thesis "Integration and Characterization of Micromachined Opitcal Microphones" (2009).
(Continued)

*Primary Examiner* — David P Porta
*Assistant Examiner* — Meenakshi S Sahu
(74) *Attorney, Agent, or Firm* — Leydig, Voit & Mayer, Ltd.

(57) ABSTRACT

The invention describes an illumination device (100) for illuminating a three dimensional arrangement (250) in an infrared wavelength spectrum. The illumination device (100) comprises at least a first group of laser devices (110) comprising at least one laser device (105) and at least a second group of laser devices (120) comprising at least one laser device (105). The first and the second group of laser devices (110, 120) are adapted to be operated independent with respect to each other. The first group of laser devices (110) is adapted to emit laser light with a first emission characteristic and the second group of laser devices (120) is adapted to emit laser light with a second emission charac- (Continued)

teristic different from the first emission characteristic. The invention further describes a distance detection device (150) and a camera system (300) comprising such an illumination device (100). The different emission characteristics may be used to compensate or take into account the depth of the three dimensional arrangement (250). Different parts of the three dimensional arrangement (250) may be illuminated by means of the first and second emission characteristic in different ways.

15 Claims, 9 Drawing Sheets

(56) References Cited

U.S. PATENT DOCUMENTS

| | | | | | |
|---|---|---|---|---|---|
| 2012/0038903 | A1* | 2/2012 | Weimer | ............... | G01C 3/08 356/4.07 |
| 2013/0266326 | A1* | 10/2013 | Joseph | ............... | H01S 5/183 398/130 |
| 2014/0355635 | A1 | 12/2014 | Iwahashi et al. | | |
| 2015/0260830 | A1* | 9/2015 | Ghosh | ............... | G01S 7/484 250/208.1 |

FOREIGN PATENT DOCUMENTS

| | | |
|---|---|---|
| WO | 2011021140 A2 | 2/2011 |
| WO | 2014087301 A1 | 6/2014 |
| WO | 2015014797 A1 | 2/2015 |

OTHER PUBLICATIONS

Gronenborn et al "Optical Components and Optical Systems for VCSEL Diode Laser Systems" (2012) Adv. Opt. Techn. pp. 389-396.

\* cited by examiner

INFRARED LASER ILLUMINATION DEVICE

CROSS-REFERENCE TO PRIOR APPLICATIONS

This application is the U.S. National Phase application under 35 U.S.C. § 371 of International Application No. PCT/EP2016/052320, filed on Feb. 4, 2016, which claims the benefit of EP Patent Application No. EP 15155687.5, filed on Feb. 19, 2015. These applications are hereby incorporated by reference herein.

FIELD OF THE INVENTION

The invention relates to an illumination device for illuminating a three dimensional arrangement in an infrared wavelength spectrum, a distance detection device and a camera system comprising such an illumination device. The invention further relates to a method of illuminating a three dimensional arrangement in an infrared wavelength spectrum.

BACKGROUND OF THE INVENTION

US 2012/0038903 A1 discloses methods and systems for adaptively controlling the illumination of a scene. In particular, a scene is illuminated, and light reflected from the scene is detected. Information regarding levels of light intensity received by different pixels of a multiple pixel detector, corresponding to different areas within a scene, and/or information regarding a range to an area within a scene, is received. That information is then used as a feedback signal to control levels of illumination within the scene. More particularly, different areas of the scene can be provided with different levels of illumination in response to the feedback signal.

The light source used for illumination may be a laser array.

SUMMARY OF THE INVENTION

It is an object of the present invention to provide an improved infrared illumination device. The illumination device may be suitable for camera systems and time of flight based distance detection devices.

According to a first aspect an illumination device for illuminating a three dimensional arrangement in an infrared wavelength spectrum is proposed. The illumination device comprises at least a first group of laser devices comprising at least one laser device and at least a second group of laser devices comprising at least one laser device. The first and the second group of laser devices are adapted to be operated independent with respect to each other. The first group of laser devices is adapted to emit laser light with a first emission characteristic. The second group of laser devices is adapted to emit laser light with a second emission characteristic different from the first emission characteristic. The first and the second emission characteristic may be chosen out of at least one of the group divergence angle, polarization, emission pulse length, mode selection and intensity.

The first and second group of lasers may, for example, be modified in a way to affect the emission e.g. by a shallow surface grating which may be provided on the emission surface of the laser device. The shallow surface grating may be used for mode selection enabling, for example, ring shaped laser modes or centralized laser modes in a laser cavity of the laser device. The laser device may preferably be a semiconductor laser diode like an edge emitting laser diode or a Vertical Cavity Surface Emitting Laser (VCSEL) emitting laser light in the wavelength range above 750 nm up to 3000 nm.

The first and second group of laser devices may emit different polarization directions. The polarization direction may also be fixed by means of a surface grating or suitable optical feedback.

The illumination device may comprise two, three, four or more groups of laser devices comprising at least one laser device. Different emission characteristics may enable an improved illumination of three dimensional arrangements. The three dimensional arrangement may comprise a scene to be illuminated by the illumination device. The different emission characteristics may be used to compensate or take into account the depth of a scene. Different parts of the three dimensional arrangement may be illuminated by means of the first, second, third etc. emission characteristic differently.

Independent control of the different groups of laser devices may be especially advantageous in dynamically changing situations. Furthermore, it may be possible to enable feedback by means of an optical detector like a charge coupled device or the like in order to adapt the emission characteristics of the different groups of laser devices with respect to reflected light. It may be possible in this case to adapt the emitted laser light to the structure of the three dimensional arrangement and additionally to surface properties of elements of the three dimensional arrangement.

The first and the second emission characteristic may, for example, be adapted such that a first surface of the three dimensional arrangement which is arranged parallel to the first and/or second group of laser devices receives less laser light emitted by the first and/or the second group of laser devices as a second surface of the three dimensional arrangement receiving laser light emitted by the first and/or the second group of laser devices. The second surface is arranged with a tilt angle to the first and second group of laser devices. The received laser light is determined by taking into account the tilt angle.

The intensity of the received laser light may thus be adapted by means of the independent control of the first and second or more emission characteristics to the relative position of surfaces of elements of the three dimensional arrangement.

The different groups of laser devices may, for example, illuminate a central part of the three dimensional arrangement differently than a part at larger angles with the aim to have an eye safe device seen under all angles but with sufficient power in all directions. In many cases the eye safety limit sets the upper boundary in forward direction (peaked emission) restricting the power to relatively low levels and ending in insufficient light levels in the outer parts. The outer parts may therefore receive more laser light which may, for example, mainly be provided by means of a different group of laser devices as the laser light received by the central part.

The illumination device may comprise a first optical device which is adapted to modify the first emission characteristic such that the laser devices of the first group of laser devices emit laser light with a first divergence angle. The laser devices of the second group of laser devices are adapted to emit laser light with a second divergence angle different from the first divergence angle.

The illumination device may further comprise a second optical device being adapted to modify the second emission characteristic such that the laser devices of the second group of laser devices emit laser light with the second divergence angle. The first and/or the second optical device may comprise an array of micro lenses.

The divergence angle is defined as the angle between two opposing points of an emission cone of a laser device at which the intensity of the laser light emitted by the laser device reaches $1/e^2$ (e Eulers number) of the maximum intensity emitted by the laser device.

The laser devices of the first and second group of laser devices may be chosen such that the divergence angles of the laser devices of the first and second group of laser devices are different. This may, for example, be done by means of different diameters of the laser cavity (e.g. diameter of mesas in case of VCSEL). The optical devices may be used as an independent measure in order to adapt the divergence angles in accordance with the application of the illumination device.

It may, for example be advantageous to use a first emission characteristic with a broad divergence angle to illuminate a region at which a defined object has to illuminated. A second and optionally a third emission characteristic with smaller divergence angle may be used to illuminate the region around the object. Independent control of the different groups of laser devices in combination with different divergence angles may be used to provide sufficient illumination of the object in the foreground and surrounding objects in the background of the three dimensional arrangement. This may, for example, be advantageous in case of surveillance applications in which a foreground object which is highly reflective may cause a bad contrast and even avoid recognition of background objects.

The first group of laser devices and the second group of laser devices are preferably arranged on one common chip arrangement. The laser devices may preferably be Vertical Cavity Surface Emitting Lasers (VCSEL). The common chip arrangement may comprise a mounting structure for assembling two chips with different laser devices. The first group of laser devices may be comprised by a first laser device array chip arranged on the mounting structure and the second group of laser devices may be comprised by a second laser device array chip arranged on the mounting structure. The laser devices or more specifically the VCSELs of the first and second group of laser devices may be different in view of threshold, aperture and the like. It may therefore be possible to adapt the emission characteristics of the first and second group of laser devices by means of the setup of the laser devices (VCSELs).

The first group of laser devices and the second group of laser devices of the illumination device may alternatively be arranged on a common chip, wherein the first group of laser devices and the second group of laser devices share one common contact layer, and wherein the first group of laser devices is electrically connected to a first electrical contact and the second group of laser devices is electrically connected to a second electrical contact. Such an integrated arrangement may enable a simple and cheap production of the illumination device. The common chip may comprise three, four or more groups of laser devices with corresponding electrical contact. Each of the group of laser devices can be independently controlled by means of the first, second, third etc. electrical contact. One or more of the group of laser devices may be combined with an optical device like an array of micro lenses, mirrors and the like in order to adapt the respective emission characteristic.

The laser devices of the first group of laser devices may be arranged in a first geometric arrangement in order to emit laser light of the first emission characteristic and the laser devices of the second group of laser devices may be arranged in a second geometric arrangement different from the first geometric arrangement in order to emit laser light of the second emission characteristic. The geometric arrangement may comprise the relative arrangement of the first and the second laser device array chip with respect to each other.

The laser devices of one group of laser devices may, for example, be arranged in a circular arrangement wherein the laser devices of another group of laser devices may be arranged in a rectangular arrangement. The distance between the laser devices may be different. Laser device of the first group of laser devices may be arranged in a rectangular array pattern and laser arrays of the second group of laser devices mas be arranged in a hexagonal array pattern.

The laser devices of the first group of laser devices may have a first aperture characteristic and the laser devices of the second group of laser devices may have a second aperture characteristic different from the first aperture characteristic. The aperture characteristics may comprise, for example, the diameter and shape of the aperture.

The illumination device may comprise a driving circuit. The driving circuit is adapted to drive the first group of laser devices with a first driving current and the second group of laser devices with a second driving current different from the first driving current. The driving circuit may be combined with any embodiment of the illumination device described above. The driving circuit may enable an independent control of the two or more group of laser devices. The driving circuit may be combined with an optical sensor in order to enable a feedback loop based on measurement data provided by the optical sensor during illumination of a scene by means of the illumination device.

According to a second aspect of the invention a distance detection device is provided. The distance detection device comprises at least one illumination device as described above, at least one photo-detector being adapted to receive reflected laser light emitted by the first and/or the second group of laser devices. The distance detection device further comprises an evaluator. The evaluator is adapted to identify the reflected laser light, and the evaluator is further adapted to determine a time of flight between a time of reception of the reflected laser light and a time of emission of the laser light.

The driving circuit is adapted such that at least one group of laser devices emits short laser pulse with a pulse length of less than 100 ns, preferably less than 50 ns, more preferably less than 20 ns. The repetition rate of the laser pulses is further adapted such that an identification of the respective laser pulse is enabled. The later depends on the expected distance. Pulse trains with repetition rates in the pulse train in the order of 10-100 MHz and repetition rate for different pulse trains in the order of some Hz to kHz may be used in a phase-shift method. The group of laser pulses used for time of flight measurement may emit laser light with a specific emission characteristic such as a defined polarization in order to simplify identification of the laser pulses and improve evaluation of the time of flight. One or more group of laser devices may be used for illumination purposes in addition to the time of flight measurement. One, two, three or more groups of laser devices of the illumination device may be used in a dual mode such that short laser pulses may be used for distance detection in a first time period and different, especially longer laser pulses may be used in a second time period for illumination in order to provide laser light with the requested emission characteristic. The results of the distance measurement may be used to improve pictures which may be made by means of light emitted by the illumination device comprised by the distance detection device. The brightness of background objects may, for example, be adapted by means of the results of the distance measurements.

According to a third aspect a camera system comprising an illumination device according to any embodiment described above is provided. The camera system comprises a camera device and an optical sensor, wherein the optical sensor is adapted to provide optical sensor data for controlling the illumination device such that the first group of laser devices emits laser light with the first emission characteristic and the second group of laser devices emits laser light with the second emission characteristic when driven by the driving circuit.

The camera system may comprise a feedback loop such that the laser light emitted by the illumination device can be adapted by means of the optical sensor data provided by means of the optical sensor. The optical sensor may be an integrated part of the camera device (e.g. charge coupled device or camera chip) or a separate optical sensor (e.g. two or more photo diodes). The feedback loop may be used to optimize the picture quality with respect to uniform illumination. The emission characteristic of a group of laser device illuminating a background of a scene may, for example, be adapted to emit more laser light if the background is too dark.

The camera system may alternatively or in addition comprise a distance detection device as described above which may be used to improve picture quality by means of the results of the distance measurements.

According to a further aspect a method of illuminating a three dimensional arrangement in an infrared wavelength spectrum is provided. The method comprises the steps of
  illuminating at least a first part of the three dimensional arrangement with at least a first group of laser devices comprising at least one laser device, wherein laser light emitted by the first group of laser devices is characterized by a first emission characteristic;
  independently illuminating at least a second part of the three dimensional arrangement with at least a second group of laser devices comprising at least one laser device, wherein laser light emitted by the second group of laser devices is characterized by a second emission characteristic different from the first emission characteristic.

The first part and the second part of the three dimensional arrangement may overlap or even be identical. The first part may be a subset of the second part or vice versa. The first and/or the second group of laser devices are controlled such that the first and/or the second part are independently illuminated. The intensity of laser light emitted by the first group of laser devices may, for example, be changed when the intensity of laser light emitted by the second group of laser devices is kept constant.

According to a further aspect a method of measuring distances is provided. The method comprises the steps of:
  illuminating at least a first part of a three dimensional arrangement with at least a first group of laser devices comprising at least one laser device, wherein laser light emitted by the first group of laser devices is characterized by a first emission characteristic;
  independently illuminating at least a second part of the three dimensional arrangement with at least a second group of laser devices comprising at least one laser device, wherein laser light emitted by the second group of laser devices is characterized by a second emission characteristic different from the first emission characteristic;
  controlling the first and/or the second group of laser devices such that a distance to the first and/or second part can be determined by means of determining a time between emitting laser light by means of the first and/or the second group of laser devices and receiving reflected laser light of the emitted laser light;
  determining the distance to the first and/or second part by means of the time between emitting laser light by means of the first and/or the second group of laser devices and receiving reflected laser light of the emitted laser light.

At least one group of laser devices may emit short laser pulses with a pulse length of less than 100 ns, preferably less than 50 ns, more preferably less than 20 ns. The repetition rate of the laser pulses is further adapted such that an identification of the respective laser pulse is enabled in order to enable an unambiguous identification of received laser light. The group of laser pulses used for time of flight measurement may emit laser light with a specific emission characteristic such as polarization in order to simplify identification of the laser pulses and improve evaluation of the time of flight. One or more group of laser devices may be used for illumination purposes in addition to the time of flight measurement. One, two, three or more groups of laser devices of the illumination device may be used in a dual mode such that short laser pulses are used for distance detection in a first time period and different especially longer laser pulses are used for illumination in a second time period in order to provide laser light with the requested emission characteristic.

According to a further aspect a method of driving a camera system as described above is provided. The method comprises the steps of:
  illuminating at least a first part of a three dimensional arrangement with at least a first group of laser devices comprising at least one laser device, wherein laser light emitted by the first group of laser devices is characterized by a first emission characteristic;
  independently illuminating at least a second part of the three dimensional arrangement with at least a second group of laser devices comprising at least one laser device, wherein laser light emitted by the second group of laser devices is characterized by a second emission characteristic different from the first emission characteristic;
  receiving a picture of the three dimensional arrangement using reflected laser light emitted by the first and/or second group of laser devices;
  analyzing a quality of the pictures;
  controlling the first and/or second group of laser devices based on the quality of the pictures.

The camera system may comprise a feedback loop such that the laser light emitted by the illumination device can be adapted by means of optical sensor data which may be provided by means of an optical sensor. The optical sensor may be an integrated part of a camera device (e.g. charge coupled device or camera chip) for receiving the picture or a separate optical sensor (e.g. two or more photo diodes). The feedback loop may be used to optimize the picture quality with respect to uniform illumination. The emission characteristic of the group of laser device illuminating a scene may, for example, be adapted if a contrast between foreground and background elements is bad.

The method may in addition comprise a step of determining a distance to one or more objects in the three dimensional arrangement as described above. The information about the distance may be used to improve the picture quality by means of adaption of the light emitted by the two or more groups of laser devices. The information about the distance to the objects may alternatively or in addition be used to automatically modify the picture by means of software tools.

It shall be understood that the illumination device of claims 1-12 and the method of 15 have similar and/or identical embodiments, in particular, as defined in the dependent claims.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a top view of a first embodiment of an illumination device.

FIG. 2 shows a principal sketch of a top view of a second embodiment of an illumination device.

FIG. 3 shows a principal sketch of a top view of a third embodiment of an illumination device.

FIG. 4 shows a principal sketch of a top view of a fourth embodiment of an illumination device.

FIG. 5 shows a principal sketch of a side view of a fifth embodiment of an illumination device.

FIG. 6 shows a principal sketch of a side view of a sixth embodiment of an illumination device.

FIG. 7 shows a principal sketch of a side view of a seventh embodiment of an illumination device.

FIG. 8 shows a principal sketch of an embodiment of a distance detection device.

FIG. 9 shows a principal sketch of an embodiment of different lighting and distance measurement sequences.

FIG. 10 shows a principal sketch of an embodiment of a camera system.

FIG. 11 shows a principal sketch of an embodiment of a driving scheme for driving an illumination device.

Figure 12:
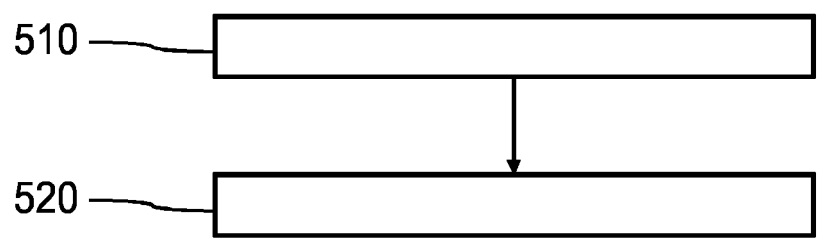

FIG. 12 shows a principal sketch of an embodiment of a method of illuminating a three dimensional arrangement.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
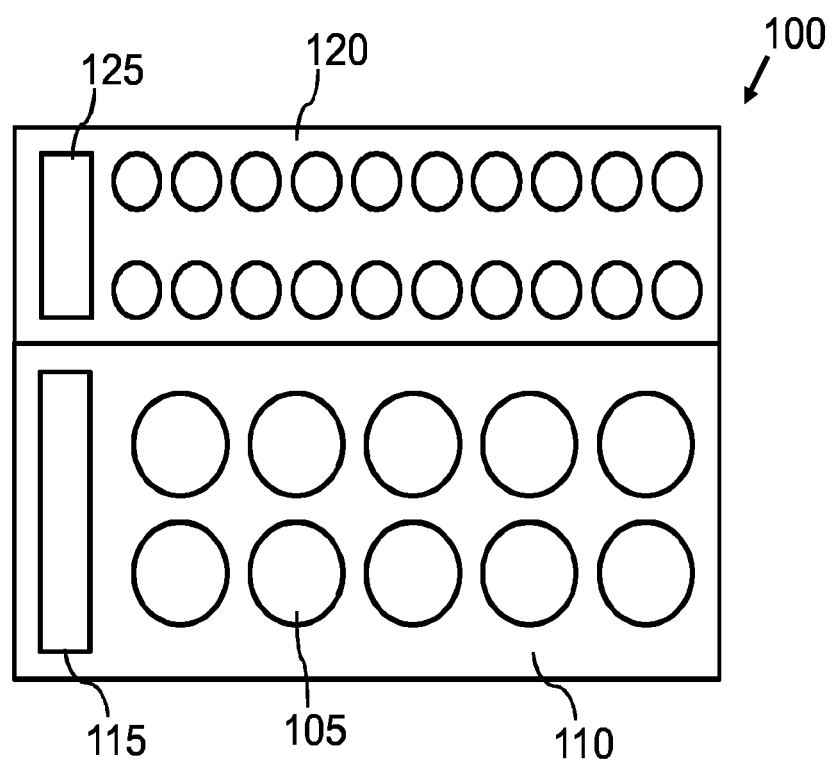

FIG. 1 shows a principal sketch of a top view of a first embodiment of an illumination device 100. The illumination device 100 comprises a first group of laser devices 110 with laser devices 105 and a second group of laser devices 120 with laser devices 105. The first and the second group of laser devices 110, 120 are arranged on a common chip. The first group of laser devices 110 can be electrically contacted via a common electrode (not shown) and a first electrical contact 115. The second group of laser devices 120 can be electrically contacted via the common electrode and a second electrical contact 125. The first and the second group of laser devices 110, 120 can be individually controlled by means of the first and the second electrical contact 115, 125. The laser devices 105 of the first group of laser devices 110 are VCSELs with an aperture having a first diameter. The laser devices 105 of the second group of laser devices 120 are VCSELs with an aperture having a second diameter smaller than the first diameter. A first emission characteristic of the first group of laser devices 110 and a second emission characteristic of the second group of laser devices 120 are different, for example, with respect to divergence angle due to the different diameters of the aperture. The first and the second emission characteristics can be further modified by means of different driving currents (amplitude, pulse shape, pulse length etc.) provided via the first and the second electrical contacts 115, 125 and the common electrode.

Figure 2:
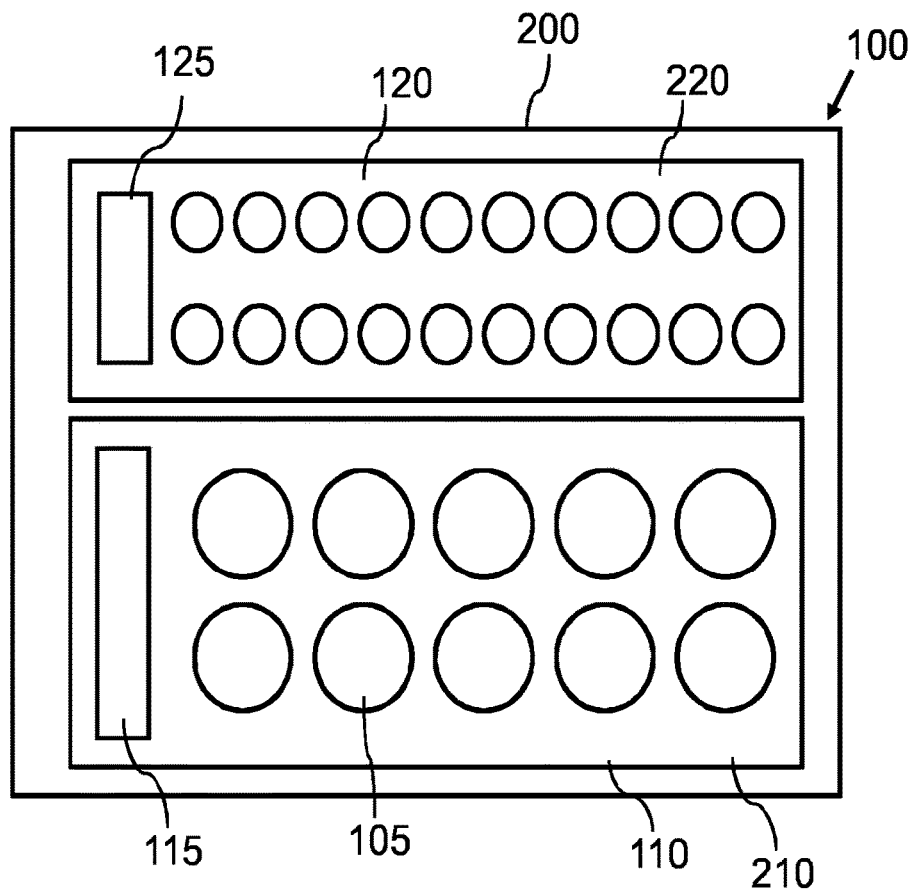

FIG. 2 shows a principal sketch of a top view of a second embodiment of an illumination device 100. The configuration of the illumination device according to the second embodiment is very similar to the first embodiment. The first group of laser devices 110 is comprised by a first laser device array chip 210 arranged on a mounting structure 200. The second group of laser devices 120 is comprised by a second laser device array chip 220 arranged on the same mounting structure 200. The common mounting structure 200 may enable the combination of very different groups of laser devices 110, 120 with very different emission characteristics. It may, for example, be possible to arrange a first group of laser devices 110 with VCSELs and a second group of laser devices 120 with side emitters. Furthermore, it may be possible to arrange the first and second laser device array chip 210, 220 tilted with respect to each other such that the emission surfaces are not parallel. It may be a further option to arrange the first and second laser device array chip 210, 220 at different levels such that a distance to an object is different.

Figure 3:
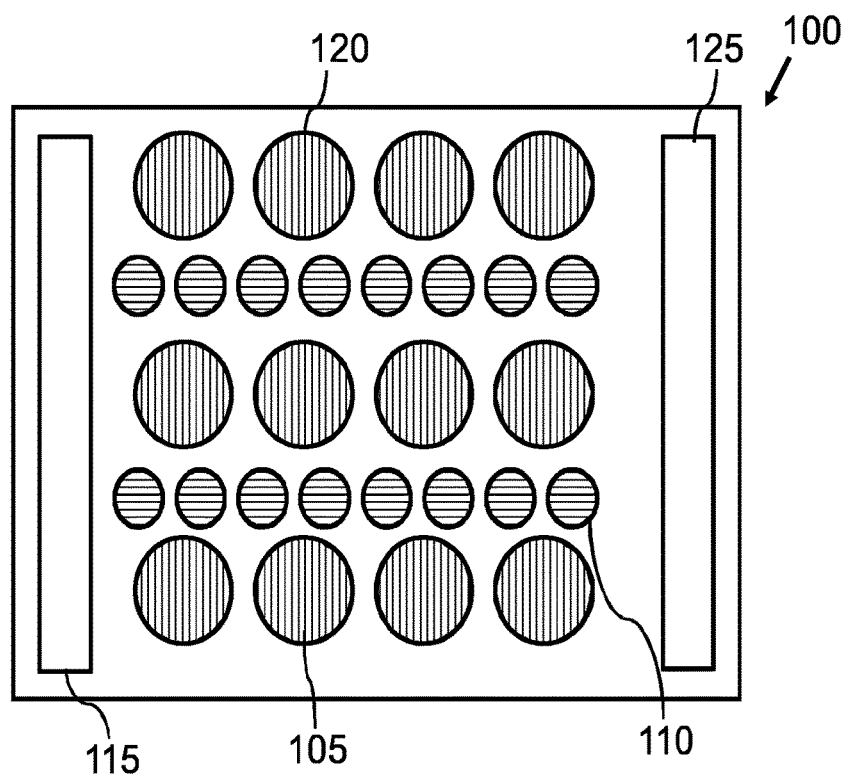

FIG. 3 shows a principal sketch of a top view of a third embodiment of an illumination device 100. The illumination device 100 comprises a first group of laser devices 110 with laser devices 105 and a second group of laser devices 120 with laser devices 105 which are arranged in alternating lines of laser devices 105. Three lines of laser devices 105 of the second group of laser devices 120 are separated by means of two lines of laser devices 105 of the first group of laser devices. The first and the second group of laser devices 110, 120 are arranged on a common chip. The first group of laser devices 110 can be electrically contacted via a common electrode (not shown) and a first electrical contact 115. The second group of laser devices 120 can be electrically contacted via the common electrode and a second electrical contact 125. The first and the second group of laser devices 110, 120 can be individually controlled by means of the first and the second electrical contact 115, 125. The laser devices 105 of the first group of laser devices 110 are VCSELs with an aperture having a first diameter and a surface grating providing a first polarization of the emitted laser light. The laser devices 105 of the second group of laser devices 120 are VCSELs with an aperture having a second diameter bigger than the first diameter and a surface grating providing a second polarization of the emitted laser light perpendicular to the first polarization. First emission characteristic of the first group of laser devices 110 and a second emission characteristic of the second group of laser devices 120 are different due to the different diameters of the aperture and the different polarization of the laser light emitted by the first or second group of laser devices 110, 120.

Figure 4:
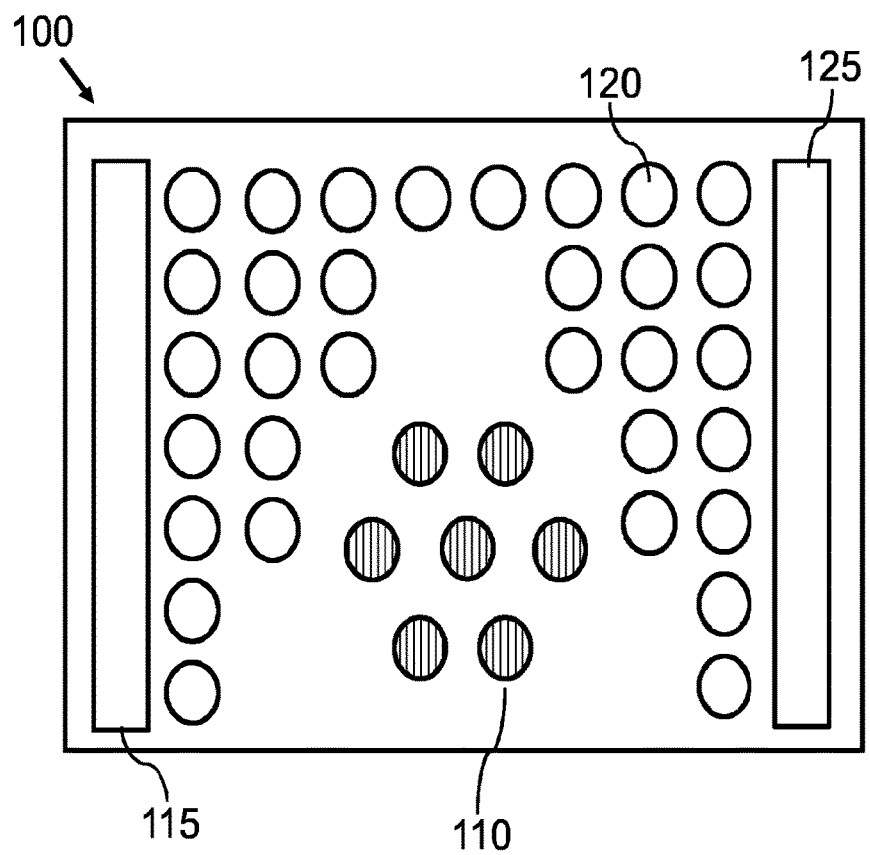

FIG. 4 shows a principal sketch of a top view of a fourth embodiment of an illumination device 100. The illumination device 100 comprises a first group of laser devices 110 with seven laser devices 105 arranged in a hexagonal pattern wherein six laser devices 105 surround one laser device placed in the middle of a hexagon. The illumination device 100 further comprises a second group of laser devices 120 with laser devices 105 which are arranged in a quadratic pattern. The laser devices 105 of the second group of laser devices 120 are further arranged in columns wherein the number of laser devices 105 is reduced step by step to the middle of the second group of laser devices 120. The laser devices 105 of the first group of laser devices 110 are placed in the middle of the second group of laser devices 110 such that the laser devices 105 of the first group of laser devices 110 are framed at the left, right and top by means of the laser devices 105 of the second group of laser devices 120. The first and the second group of laser devices 110, 120 are arranged on a common chip. The first group of laser devices 110 can be electrically contacted via a common electrode (not shown) and a first electrical contact 115. The second group of laser devices 120 can be electrically contacted via the common electrode and a second electrical contact 125. The first and the second group of laser devices 110, 120 can be individually controlled by means of the first and the second electrical contact 115, 125. The laser devices 105 of the first and second group of laser devices 110, 120 are VCSELs with the same aperture. The VCSELs of the first group of laser devices 110 comprise a surface grating providing a first polarization of the emitted laser light. A first emission characteristic of the first group of laser devices 110 and a second emission characteristic of the second group of laser devices 120 is different due to the different geometric arrangement of the VCSELs (distances between the VCSELs and quadratic versus hexagonal pattern) and the first polarization of the laser light emitted by the first group of laser devices 110.

Figure 5:
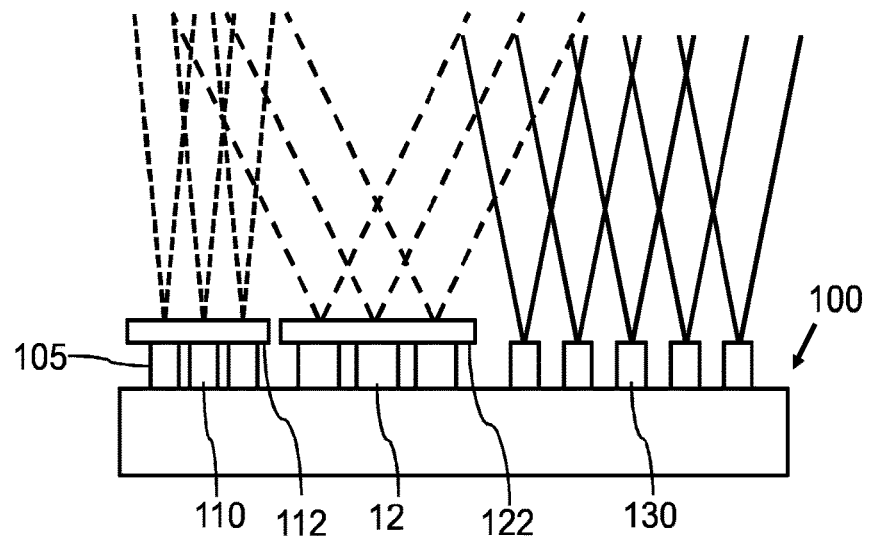

FIG. 5 shows a principal sketch of a side view of a fifth embodiment of an illumination device 100. The illumination device 100 comprises a first group of laser devices 110 with laser devices 105, a second group of laser devices 120 with laser devices 105 and a third group of laser devices 120 with laser devices 105. The first, second and third group of laser devices 110, 120, 130 are arranged on a common chip. The laser devices 105 of the first, second and third group of laser devices 110, 120, 130 are VCSELs with different diameters of the mesas. The laser devices 105 of the first, second and third group of laser devices 110, 120, 130 are arranged such that neighboring laser devices 105 of the respective group of laser devices 110, 120, 130 have different distances (pitch) with respect to each other. The emission characteristics of the first, second and third group of laser devices 110, 120, 130 are different due to the different diameter of the mesas, different threshold currents and pitch. The laser devices 105 of the first, second and third group of laser devices 110, 120, 130 emit laser light with different divergence angles. The divergence angle of the first group of laser devices 110 is further modified by means of a first optical device 112 such that the laser devices 105 emit laser light with a narrow divergence angle. The divergence angle of the second group of laser devices 120 is modified by means of a second optical device 122 such that the laser devices 105 emit laser light with a broad divergence angle. The first, second and third group of laser devices 110, 120, 130 can be individually addressed by means of separate first, second and third electrical contacts (not shown).

Figure 6:
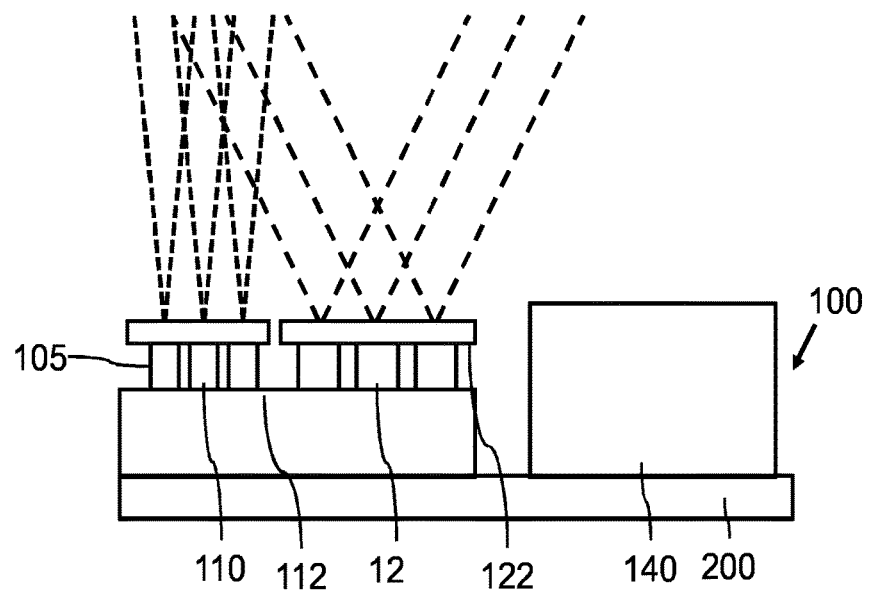

FIG. 6 shows a principal sketch of a side view of a sixth embodiment of an illumination device 100. The illumination device 100 comprises a first group of laser devices 110 with laser devices 105 and a second group of laser devices 120 with laser devices 105. The first and second groups of laser devices 110, 120 are arranged on a common chip. The laser devices 105 of the first and second group of laser devices 110, 120 are VCSELs with different diameters of the mesas. The laser devices 105 of the first and second group of laser devices 110, 120 are arranged such that neighboring laser devices 105 of the respective group of laser devices 110, 120 have the same distances (pitch) with respect to each other. The laser devices 105 of the first and second group of laser devices 110, 120 emit laser light with different divergence angles. The divergence angle of the first group of laser devices 110 is modified by means of a first optical device 112 (array of micro lenses) such that the laser devices 105 emit laser light with a narrow divergence angle. The divergence angle of the second group of laser devices 120 is modified by means of a second optical device 122 (array of micro lenses) such that the laser devices 105 emit laser light with a broad divergence angle. The first and second group of laser devices 110, 120 are individually supplied with first and second driving currents by means of the a driving circuit 140 which is arranged on a mounting structure 200 with the common chip of the first and second group of laser devices 110, 120. The first and second driving current are supplied via a common electrode (not shown) of the first and second group of laser devices 110, 120 and separate first and second electrical contacts (not shown).

Figure 7:
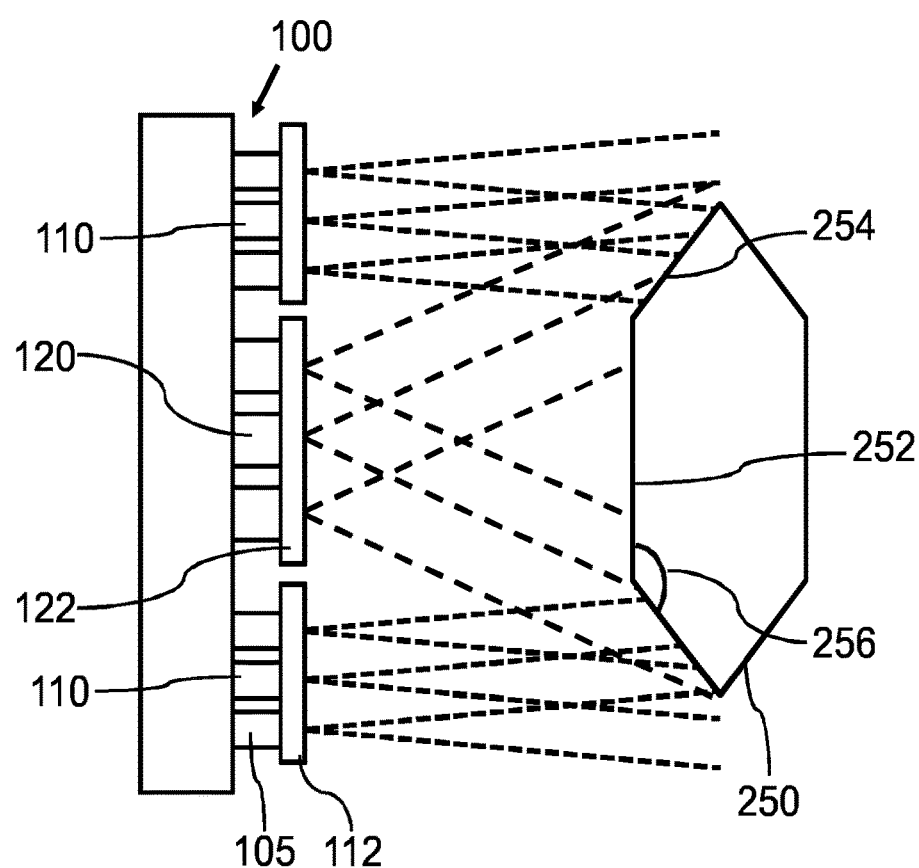

FIG. 7 shows a principal sketch of a side view of a seventh embodiment of an illumination device 100. The illumination device 100 comprises a first group of laser devices 110 with laser devices 105 and a second group of laser devices 120 with laser devices 105. The first and second groups of laser devices 110, 120 are arranged on a common chip. The laser devices 105 of the first and second group of laser devices 110, 120 are VCSELs with different diameters of the mesas. The laser devices 105 of the first and second group of laser devices 110, 120 are arranged such that neighboring laser devices 105 of the respective group of laser devices 110, 120 have the different distances (pitch) with respect to each other. The laser devices 105 of the first group of laser devices 110 are arranged in a ring around the laser devices 105 of the second group of laser devices 120. The laser devices 105 of the first and second group of laser devices 110, 120 emit laser light with different divergence angles. The divergence angle of the first group of laser devices 110 is modified by means of a first optical device 112 (array of micro lenses) such that the laser devices 105 emit laser light with a narrow divergence angle. The divergence angle of the second group of laser devices 120 is modified by means of a second optical device 122 (array of micro lenses) such that the laser devices 105 emit laser light with a broad divergence angle. The first and second group of laser devices 110, 120 is individually supplied with first and second driving currents by means of a driving circuit (not shown). The first and second driving current are supplied via a common electrode (not shown) of the first and second group of laser devices 110, 120 and separate first and second electrical contacts (not shown). The first and the second emission characteristic are adapted such that a first surface 252 of a three dimensional arrangement 250 which is arranged parallel to the first and second group of laser devices 110, 120 receives less laser light especially emitted by the second group of laser devices 120 as a second surface 254 of the three dimensional arrangement 250 receiving laser light emitted by the first and the second group of laser devices 110, 120. The second surface is arranged with a tilt angle 256 to the first and second group of laser devices 110, 120. The laser light received on the second surface 254 is calculated by taking into account the tilt angle 256. The tilt angle 256 is used to calculate the projection of the second surface 254 to an area being essentially parallel to the first and second group of laser devices 110, 120. The different divergence angles and the individual control of the group of laser devices 110, 120 enables to adapt the brightness of the first and second surface 252, 254 with respect to each other.

Figure 8:
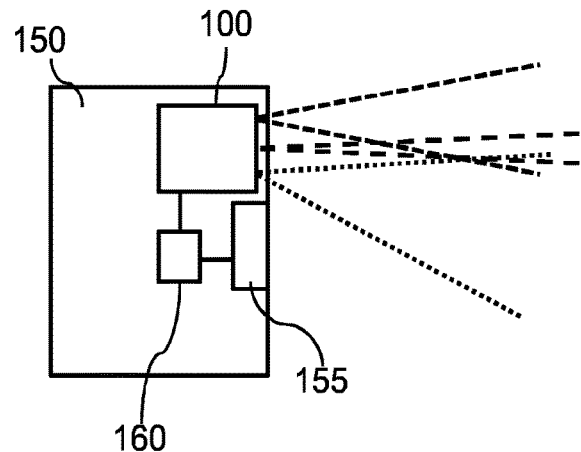

FIG. 8 shows a principal sketch of an embodiment of a distance detection device 150. The distance detection device 150 comprises one illumination device 100. The illumination device 100 comprises three groups of laser devices with three different emission characteristics. The distance detection device 150 further comprises a photo-detector 155 being adapted to receive reflected laser light emitted by one or more of the groups of laser devices. The distance detection device 150 further comprises an evaluator 160. The evaluator 160 is coupled with the illumination device 100 and the photo-detector 155. The evaluator 160 is adapted to identify the reflected laser light. The evaluator 160 is further adapted to determine a time of flight between a time of reception of the reflected laser light and a time of emission of the laser light by means of electrical signals received from the illumination device 100 (e.g. start of a pulse with defined pattern) and the photo-detector 155 (e.g. start of reception of the pulse with the defined pattern). The evaluator 160 may alternatively only get the emitted pattern from the illumination device 100 at a time t1 and get the received pattern from the photo-detector 155 at time t2. The patterns are compared and the time difference between t2 and t1 is taken as time of the respective laser pulse if both patterns are identical.

Figure 9:
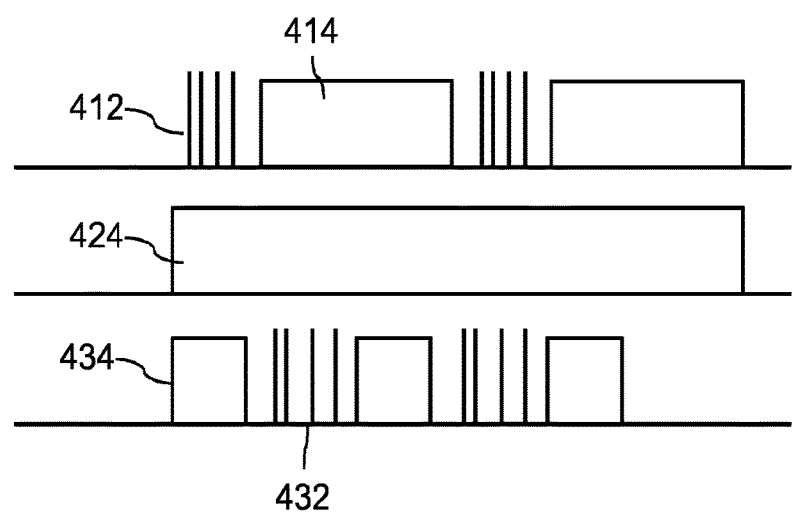

FIG. 9 shows a principal sketch of an embodiment of different lighting and distance measurement sequences. The upper sequence shows a first pulse train 412 and a first lighting sequence 414 emitted by the first group of laser devices of the distance detection device 150 shown in FIG. 8. The first pulse train 412 of short laser pulses is used for distance detection, and wherein the first lighting sequence 414 is used for illuminating a first part of a three dimensional arrangement. The sequence in the middle shows a second lighting sequence 424 emitted by the second group of laser devices of the distance detection device 150 shown in FIG. 8. The second lighting sequence 424 is used for illuminating a second part of the three dimensional arrangement. The lower sequence shows a second pulse train 432 and a third lighting sequence 434 emitted by the third group of laser devices of the distance detection device 150 shown in FIG. 8. The second pulse train 432 of short laser pulses is used for distance detection, and wherein the third lighting sequence 434 is used for illuminating a third part of the three dimensional arrangement.

Figure 10:
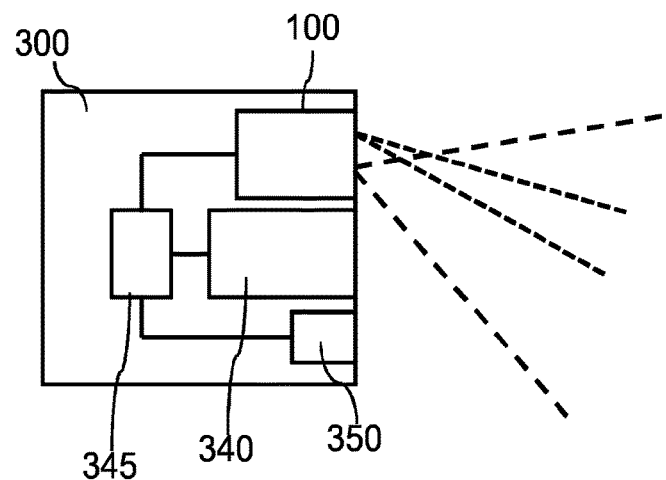

FIG. 10 shows a principal sketch of an embodiment of a camera system 300. The camera system comprises an illumination device 100 with two groups of laser devices, a camera device 340, an optical sensor and a camera controller 345. The optical sensor 350 is adapted to provide optical sensor data to the camera controller which is coupled with the camera device 340 and the illumination device 100. The optical sensor data is used for controlling the illumination device 100 in order to adapt first and second emission characteristic of the first and second group of laser devices. The camera controller 345 enables a feedback loop taking into account the first and second lighting characteristic of the illumination device 100 and the sensitivity of the camera device 340.

Figure 11:
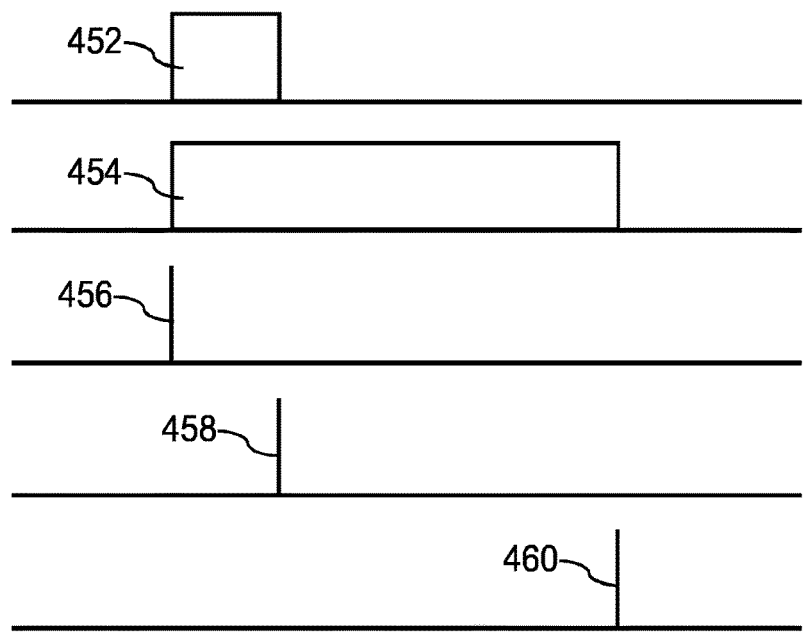

FIG. 11 shows a principal sketch of an embodiment of a driving scheme for driving the illumination device 100 of the camera system 300 shown in FIG. 10. The first and second group of laser devices start emitting laser light with the first and second emission characteristic 452, 454 after a corresponding driving circuit receives start pulse 456. The first group of laser devices stops emission of laser light after the driving circuit receives the first stop pulse 458. The first emission characteristic 452 is characterized by a relative short time of emitting laser light. The second group of laser devices stops emission of laser light after the driving circuit receives the second stop pulse 460. The second emission characteristic 454 is characterized by a relative long time of emitting laser light. The first emission characteristic 452 may, for example, be used to illuminate an object passing a background of a scene during the time period between the start pulse 456 and first stop pulse 458.

FIG. 12 shows a principal sketch of an embodiment of a method of illuminating a three dimensional arrangement. In step 510 at least a first part of the three dimensional arrangement 250 is illuminated with at least a first group of laser devices 110 comprising at least one laser device 105, wherein laser light emitted by the first group of laser devices 110 is characterized by a first emission characteristic. In step 520 at least a second part of the three dimensional arrangement 250 is independently illuminated with at least a second group of laser devices 120 comprising at least one laser device 105, wherein laser light emitted by the second group of laser devices 120 is characterized by a second emission characteristic different from the first emission characteristic.

It is a basic idea of the present invention to provide a flexible and simple illumination device for illuminating a three dimensional arrangement in the infrared wavelength range at wavelength above 750 nm. At least two groups of laser devices, preferably VCSELs, are used to illuminate parts or even the whole three dimensional arrangement with at least two different emission characteristics in order to provide a homogeneous illumination of elements of the three dimensional arrangement at different distances to the illumination device.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 100 illumination device
105 laser device 110 first group of laser devices
112 first optical device
115 first electrical contact
120 second group of laser devices
122 second optical device
125 second electrical contact
130 third group of laser devices
140 driving circuit
150 distance detection device
155 photo detector
160 evaluator
200 mounting structure
210 first laser device array chip
220 second laser device array chip
250 three dimensional arrangement
252 first surface
254 second surface
256 tilt angle
300 camera system
340 camera device
345 camera controller
350 optical sensor
412 first pulse train
414 first lighting sequence
424 second lighting sequence
432 second pulse train
434 third lighting sequence
452 first emission characteristic
454 second emission characteristic
456 start pulse
458 first stop pulse
460 second stop pulse
510 step of illuminating by means of the first group of laser devices
520 step of illuminating by means of the second group of laser devices

The invention claimed is:

1. An illumination device comprising:
at least a first group of laser devices, the first group of laser devices comprising at least one laser device, wherein the first group of laser devices is arranged to emit laser light with a first emission characteristic;
at least a second group of laser devices, the second group of laser devices comprising at least one laser device, wherein the second group of laser devices is arranged to emit laser light with a second emission characteristic; and
a first optical device, wherein the first optical device is arranged to modify the first emission characteristic such that the laser devices of the first group of laser devices emit laser light with a first divergence angle, and the laser devices of the second group of laser devices are arranged to emit laser light with a second divergence angle,
wherein the first group and the second group of laser devices are arranged to operate independently with respect to each other,
wherein the second emission characteristic is different from the first emission characteristic,
wherein the second divergence angle is different from the first divergence angle,
wherein the first emission characteristic and the second emission characteristic are arranged to illuminate different parts of a three dimensional arrangement differently.

2. The illumination device according to claim 1, further comprising a driving circuit and a sensor,
wherein the driving circuit is arranged to drive the first group of laser devices with a first driving current and the second group of laser devices with a second driving current,
wherein the second driving current is different from the first driving current,
wherein the laser light reflected by the three-dimensional arrangement is determined by the sensor,
wherein the driving circuit is arranged to control the first emission characteristic and the second emission characteristic using feedback signals generated by the sensor,
wherein the three dimensional arrangement has a first surface and a second surface,
wherein the first surface is parallel to the first group of laser devices and the second group of laser devices,
wherein the second surface is arranged with an tilt angle relative to the first group of laser devices and the second group of laser devices,
wherein the first emission characteristic and the second emission characteristic are arranged by means of the first and second divergence angle such that the first surface receives less laser light emitted by the first and/or the second group of laser devices as the second surface.

3. The illumination device according to claim 1, further comprising a second optical device wherein the second optical device is arranged to modify the second emission characteristic such that the laser devices of the second group of laser devices emit laser light with the second divergence angle.

4. The illumination device according to claim 1, wherein the first group of laser devices and the second group of laser devices are arranged on a common chip arrangement.

5. The illumination device according to claim 4, wherein the laser devices are Vertical Cavity Surface Emitting Lasers.

6. The illumination device according to claim 5,
wherein the first group of laser devices comprises a first laser device array chip arranged on a mounting structure,
wherein the second group of laser devices comprises a second laser device array chip arranged on the mounting structure.

7. The illumination device according to claim 5,
wherein the first group of laser devices and the second group of laser devices are arranged on a common chip,
wherein the first group of laser devices and the second group of laser devices share one common contact layer,
wherein the first group of laser devices is electrically connected to a first electrical contact and the second group of laser devices is electrically connected to a second electrical contact.

8. The illumination device according to claim 6,
wherein the laser devices of the first group of laser devices are arranged in a first geometric arrangement and the laser devices of the second group of laser devices are arranged in a second geometric arrangement,
wherein the second geometric arrangement is different from the first geometric arrangement.

9. The illumination device according to claim 6,
wherein the laser devices of the first group of laser devices have a first aperture characteristic and the laser devices of the second group of laser devices have a second aperture characteristic,
wherein the second aperture characteristic is different from the first aperture characteristic.

10. A distance detection device comprising:
at least one illumination device according to claim 1;
at least one photo-detector; and
an evaluator;
wherein the photo-detector is arranged to receive reflected laser light emitted by the first and/or the second group of laser devices,
wherein, the evaluator is arranged to identify the reflected laser light,
wherein the evaluator is arranged to determine a time of flight,
wherein the time of flight is a difference between a time of reception of the reflected laser light and a time of emission of the laser light.

11. A camera system comprising:
the illumination device according to claim 1;
a camera device; and
an optical sensor,
wherein the optical sensor is arranged to provide optical sensor data to the the driving circuit,
wherein the driving circuit is arranged to control the illumination device such that the first group of laser devices emits laser light with the first emission characteristic and the second group of laser devices emits laser light with the second emission characteristic.

12. A method of illuminating a three dimensional arrangement comprising the steps of:
illuminating at least a first part of a three dimensional arrangement using at least a first group of laser devices, the first group of laser devices comprising at least one laser device,
wherein laser light emitted by the first group of laser devices is characterized by a first emission characteristic;
modifying the first emission characteristic using a first optical device such that the laser devices of the first group of laser devices emit laser light with a first divergence angle;
illuminating at least a second part of the three dimensional arrangement with at least a second group of laser devices, the second group of laser devices comprising at least one laser device,
wherein laser light emitted by the second group of laser devices is characterized by a second emission characteristic,
wherein the second emission characteristic is different from the first emission characteristic,
wherein the second emission characteristic is characterized by a second divergence angle,
wherein the second divergence angle is different from the first divergence angle,
arranging the first emission characteristic and the second emission characteristic using the first divergence angle and second divergence angle such that different parts of the three dimensional arrangement are illuminated differently.

13. The illumination device according to claim 1, wherein the laser device emits light in the infrared wavelength spectrum.

14. The illumination device according to claim 1, wherein the first diversion angle and second divergence angle are arranged to illuminate different parts of the three dimensional arrangement differently.

15. The illumination device according to claim 2, wherein the first emission characteristic and the second emission characteristic are arranged to use the first divergence angle and second divergence angle, such that the first surface receives less laser light emitted by the first and/or the second group of laser devices as the second surface.

* * * * *